United States Patent
Huang et al.

(12) 
(10) Patent No.: US 6,420,791 B1
(45) Date of Patent: Jul. 16, 2002

(54) ALIGNMENT MARK DESIGN

(75) Inventors: Chien-Chao Huang, Kaohsiung; Anseime Chen; Shih-Che Wang, both of Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/448,083

(22) Filed: Nov. 23, 1999

(51) Int. Cl.[7] ............................................. H01L 23/544
(52) U.S. Cl. ...................... 257/797; 257/750; 257/758; 438/401; 438/462; 438/975
(58) Field of Search ................. 257/797, 722; 438/401, 462, 975

(56) References Cited

U.S. PATENT DOCUMENTS

| | | | | |
|---|---|---|---|---|
| 5,401,691 A | * | 3/1995 | Cadwell | 438/401 |
| 5,627,110 A | * | 5/1997 | Lee et al. | 438/692 |
| 5,801,090 A | * | 9/1998 | Wu et al. | 438/622 |
| 5,872,042 A | * | 2/1999 | Hsu et al. | 438/401 |
| 5,911,108 A | * | 6/1999 | Yen | 438/401 |
| 5,933,744 A | * | 8/1999 | Chen et al. | 438/401 |
| 6,133,641 A | * | 10/2000 | Hamada et al. | 257/797 |
| 6,184,104 B1 | * | 2/2001 | Tan et al. | 438/401 |

* cited by examiner

Primary Examiner—Jasmine J B Clark
(74) Attorney, Agent, or Firm—Charles C. H. Wu; Wu & Cheung, LLP

(57) ABSTRACT

An alignment mark design has a metal plateau and a metal material formed over a substrate. The metal plateau is within a first dielectric layer. Openings within a second dielectric layer above the first dielectric layer are filled with a metal material. The metal material and the second dielectric layer alternate so that a part of the exposure light passing through the second dielectric layer between sections of the metal material can be reflected into an alignment system by the metal plateau.

16 Claims, 3 Drawing Sheets

ALIGNMENT MARK DESIGN

BACKGROUND OF THE INVENTION

1. Field of the Invention

The invention relates in general to a design of semiconductor integrated circuits (ICs), and more particularly to a design of floating non-zero mark which has a good alignment.

2. Description of the Related Art

Photolithography is a critical process in the fabrication of semiconductor devices. Depending on the complexity of the semiconductor device, the number of photoresist depositions and light exposure operations ranges from 10 to 18. Hence, in order to transfer correctly a pattern to a wafer, the photomask must be properly aligned before the photoresist is exposed to light.

In conventional photo-exposure operation, alignment marks must be formed on the silicon wafer so that the alignment marks are able to match with the corresponding marks on the photomask. Alignment marks comprise a zero mark and a floating non-zero mark. Step height of an alignment mark is capable of providing a scattering field or a diffraction edge. When a laser light source, for example, a helium-neon (He—Ne) laser having a wavelength of 635 nm, shines on the alignment mark, a diffraction pattern is generated. The diffraction pattern can be reflected back and intercepted by an alignment sensor or a first order diffraction interferometer alignment system for recording the positional data.

One kind of alignment marks is formed in a provided substrate by a photolithography and etching process. Since an alignment mark is formed in the substrate, the alignment mark is also called "Zero mark". The alignment of one layer to the next is accomplished in a stepper. The purpose of the stepper is to transfer a desired pattern situated on a reticle to a layer formed on a wafer. In a typical alignment operation, a wafer, having a zero mark, is coated with a transparent photosensitive material. The stepper utilizes a laser beam to sense the position of a zero mark as a reference point in adjusting the position of the reticle over the wafer to precisely align the reticle to the previous layer on the wafer. The stepper utilizes a laser beam with a fixed wavelength to sense the position of a zero mark on the wafer.

However, after a metal layer is deposited on the wafer, which has been globally planarized, the zero mark for the stepper is no longer visible. That is, the laser beam of the stepper cannot sense the position of the zero mark, since the zero mark is covered by the opaque metal layer. In order to carry out the alignment and patterning of the metal layer, an extra etching step is required to form an opening in the metal layer directly over the zero mark, to thereby recover the visibility of the zero mark. It is appreciated that the conventional etching process often comprises at least one complicated, costly and time-consuming photolithography step.

A non-zero mask is formed on a planarized dielectric layer over a provided substrate. Under the planarized dielectric layer, structures, such as wiring lines, MOS transistors and contacts, have been formed over the substrate, in which structures a zero mark has failed to provide a alignment function. Openings are formed within the dielectric layer. A conductive material is formed to fill the openings while performing a metallization process. Since the conductive material is so dense that light cannot pass through the conductive material and the dielectric layer, such as silicon oxide, is vitreous, the structure used as a zero mark can provide a grating function for alignment.

However, the non-zero mark is formed on a dielectric layer so that a part of exposure light does not only pass through the non-zero mark but also passes through the dielectric layer. Thus, the part of exposure light cannot be reflected to an alignment system. Alignment error is easily formed while using the non-zero mark for alignment.

SUMMARY OF THE INVENTION

The invention provides an alignment mark design. Exposure light passing through a non-zero mark can be completely reflected to an alignment system. Alignment error is thereby avoided.

The alignment mark design comprises a metal plateau and a metal material formed over a provided substrate. A first dielectric layer is formed on the substrate. The metal plateau is within the first dielectric layer. A second dielectric layer having openings is formed on the first dielectric layer. The openings are positioned on the metal plateau. The openings within the second dielectric layer are filled with metal material. Exposure light can pass through the second dielectric layer. Since the metal material and the second dielectric layer are alternating, a part of the exposure light passing through the second dielectric layer between sections of the metal material can be reflected into an alignment system by the metal plateau.

Furthermore, the metal plateau comprises three types. A first type is a rectangular plateau which sets a range comprising the metal material. A second type comprises metal slivers which are orthogonal to the metal material. A third type comprises metal slivers which are parallel to the metal material and located under the second dielectric layer between sections of the metal material.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
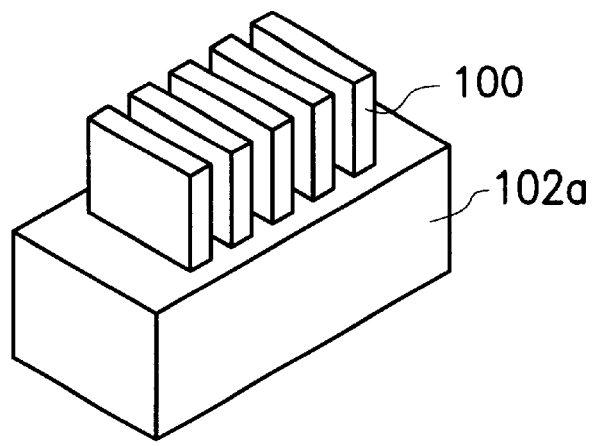
FIGS. 1A–1C are perspective drawings showing structures of one preferred embodiment of the alignment mark design.
Figure 1B:
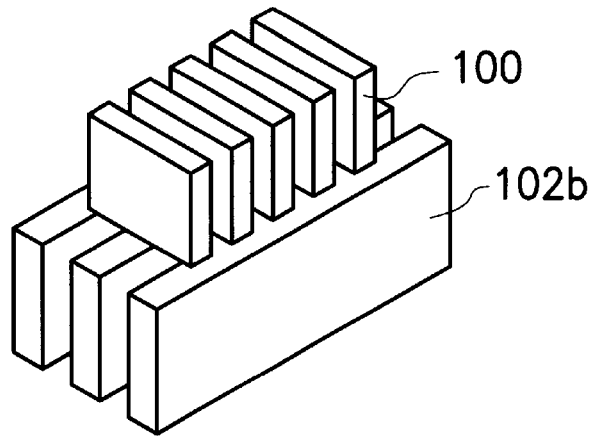
Figure 1C:
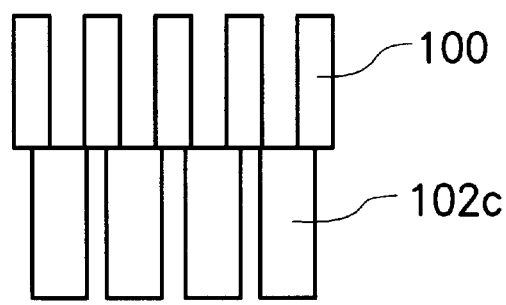

FIGS. 1A–1C are perspective drawings showing structures of one preferred embodiment of the alignment mark design.

A non-zero mask is formed on a planarized dielectric layer over a provided substrate. Under the planarized dielectric layer, structures, such as wiring lines, MOS transistors and contacts, have been formed over the substrate, wherein a zero mark has failed to provide a alignment function. Openings are formed within the dielectric layer. A conductive material is formed to fill the openings while performing a metallization process. Since the conductive material is so dense that light cannot pass through the conductive material and the dielectric layer, such as silicon oxide, is vitreous, the structure used as a zero mark can provide a registration function for alignment.

The structures shown in FIGS. 1A–1C only show a metal material 100 filling the openings, which is described above, and metal plateaus 102a, 102b, 102c under the metal material 100. Dielectric layers described above are not shown in FIGS. 1A–1C. Dielectric material and the metal material form a non-zero mark.

In FIG. 1A, the metal plateau 102a is a rectangular plateau located in an area comprising the non-zero mark. In FIG. 1B, the metal plateau 102b comprises metal slivers which are orthogonal to the metal material. In FIG. 1C, the metal plateau 102c comprises metal slivers which are parallel to the metal material. The metal plateau 102 is further located under the dielectric material between sections of the metal material 100.

Figure 2A:
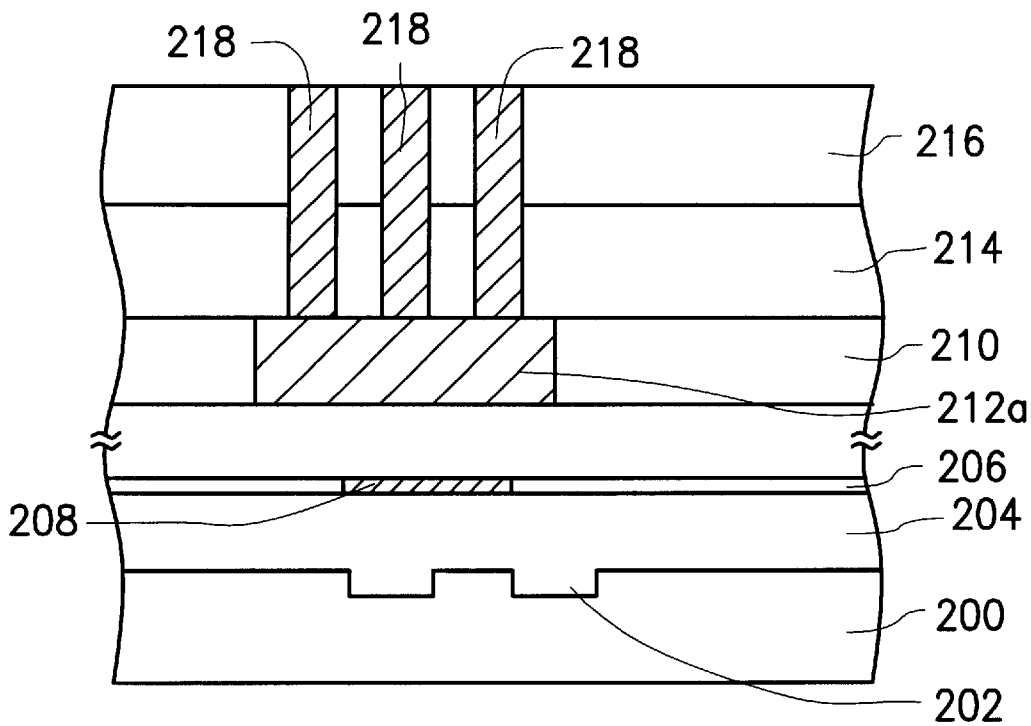
FIG. 2A is a schematic, cross-sectional view showing the alignment marks of FIGS. 1A and 1B, which are used for a dual damascene process.
Figure 2B:
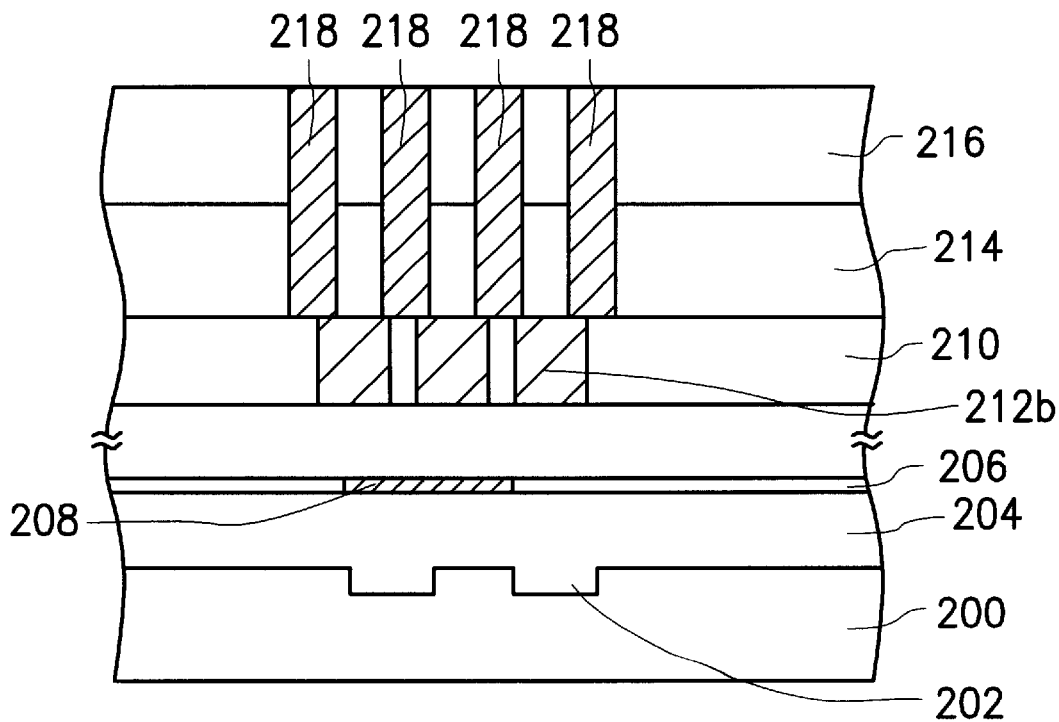
FIG. 2B is a schematic, cross-sectional view showing the alignment mark of FIG. 1C, which is used for a dual damascene process.

FIG. 2A is a cross-sectional view showing the alignment marks of FIGS. 1A and 1B, which are used for a dual damascene process. FIG. 2B is a cross-sectional view showing the alignment mark of FIG. 1C, which is used for a dual damascene process.

A substrate having a zero mark is provided. The zero mark 202 is used for alignment while performing photolithography processes above the substrate 200, such as forming transistors on the substrate 200 or patterning a dielectric layer for forming word lines or bit lines. A dielectric layer 204 is formed over the substrate 200 and is patterned for forming a first wiring line 208. The zero mark 202 is still used for patterning the dielectric layer 204. A mask layer or etching stop layer 206 is formed on the dielectric layer 204. A material of the mask layer (etching stop layer) 206 comprises silicon nitride.

Until the zero mark 202 can not provide a function of alignment, a dielectric layer 210 is formed on the dielectric layer 204 and on the mask layer (etching stop layer) 206. Metal plateaus 212a, 212b or 212c are formed within the dielectric layer 210. Dielectric layers 214 and 216 are located on the metal plateau 212a, 212b or 212c. The dielectric layer 214 has via holes therein. The dielectric layer 216 has trenches above the via holes. The trenches and the via holes are filled with a metal 218, such as copper, to form a dual damascene structure.

According to the alignment mark design described above, the dielectric material, such as silicon oxide, is between sections of the metal material 218. The dielectric material and the metal material 218 provide a grating function. The exposure light passing through the dielectric material is diffracted. The metal plateau 212a and 212b can reflect the passing light to an alignment system. Precision of alignment can thus be increased.

Figure 3A:
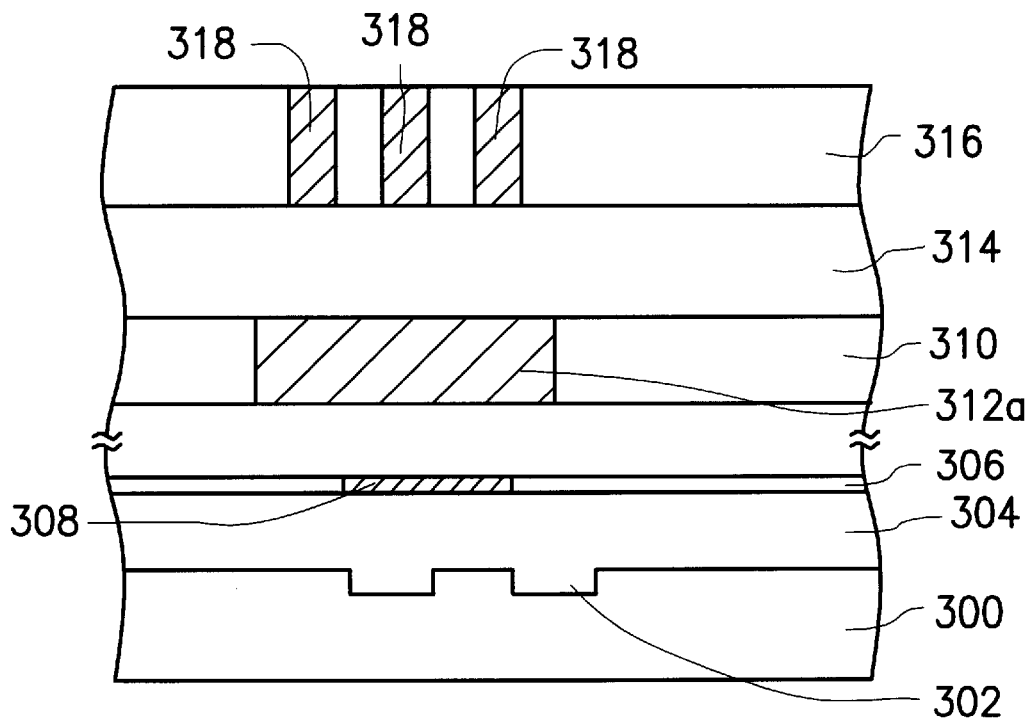
FIG. 3A is a schematic, cross-sectional view showing the alignment marks of FIGS. 1A and 1B, which are used for forming wiring lines and performing a CMP process.
Figure 3B:
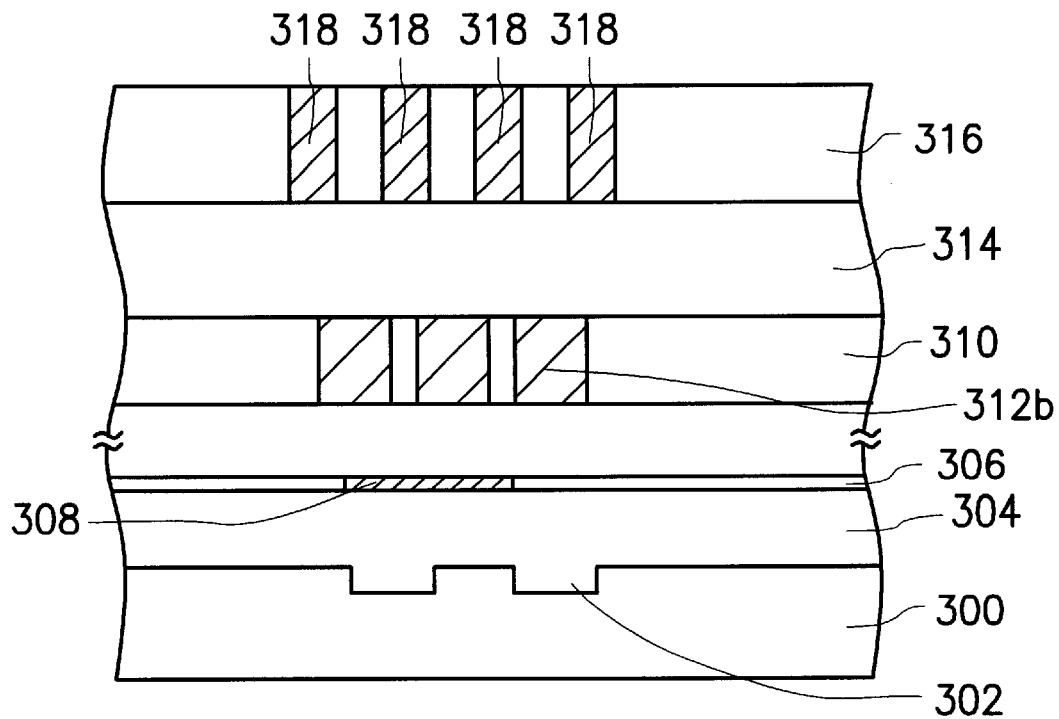
FIG. 3B is a schematic, cross-sectional view showing the alignment mark of FIG. 1C, which is used for forming wiring lines and performing a CMP process.

FIG. 3A is a schematic, cross-sectional view showing the alignment marks of FIGS. 1A and 1B, which are used for forming wiring lines and performing a CMP process. FIG. 3B is a schematic, cross-sectional view showing the alignment mark of FIG. 1C, which is used for forming wiring lines and performing a CMP process.

A substrate 300 having a zero mark 302 is provided. The zero mark 302 is used for alignment while performing photolithography processes above the substrate 300, such as forming transistors on the substrate 300 or patterning a dielectric layer for forming word lines or bit lines. A dielectric layer 304 is formed over the substrate 300 and is patterned for forming a first wiring line 308. The zero mark 302 is still used for patterning the dielectric layer 304. A mask layer Or etching stop layer 306 is formed on the dielectric layer 304. A material of the mask layer (etching stop layer) 306 comprises silicon nitride.

Until the zero mark 302 cannot provide a function of alignment, a dielectric layer 310 is formed on the dielectric layer 304 and on the mask layer (etching stop layer) 308. Metal plateaus 312a or 312b are formed within the dielectric layer 310. Dielectric layers 314 and 316 are on the metal plateau 312a or 312b. The dielectric layer 316 has trenches above the metal plateaus 312a or 312b and other regions above the substrate. The trenches are filled with a metal 318, such as tungsten, to form wiring lines.

According to the alignment mark design described above, the dielectric material, such as silicon oxide, is located between sections of the metal material 318. The dielectric material and the metal material 318 provide a grating function. The exposure light passing through the dielectric material is diffracted. The metal plateaus 312a and 312b can reflect the passing light to an alignment system. Precision of alignment can thus be increased.

In the invention, the metal plateaus can have different designs. However, these designs are used to reflect exposure light, which passes through dielectric material located at the non-zero mark, to the alignment system.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An alignment mark design, which is formed over a substrate comprising a zero mark formed therein and a plurality of structural layers formed thereon, comprising:
   a first dielectric layer over the substrate;
   a metal plateau formed within the first dielectric layer, wherein the metal plateau is positioned over the zero mark;
   a second dielectric layer on the first dielectric layer and on the metal plateau, wherein the second dielectric layer has a plurality of openings; and
   a metal material filled up the openings.

2. The alignment mark design according to claim 1, wherein the openings are positioned above the metal plateau.

3. The alignment mark design according to claim 1, wherein formation of the metal material is applicable to forming a dual damascene structure.

4. The alignment mark design according to claim 1, wherein the metal material is used to form a plurality of wiring lines.

5. The alignment mark design according to claim 2, wherein the metal plateau is a rectangular plateau.

6. The alignment mark design according to claim 2, wherein the metal plateau comprises a plurality of metal slivers, and the metal slivers are orthogonal to the metal material.

7. The alignment mark design according to claim 2, wherein the metal plateau comprises a plurality of metal slivers, and the metal slivers are parallel to the metal material.

8. The alignment mark design according to claim 3, wherein the metal material comprises copper.

9. The alignment mark design according to claim 8, wherein a material of the metal plateau is copper.

10. The alignment mark design according to claim 4, wherein the metal material comprises tungsten.

11. The alignment mark design according to claim 10, wherein a material of the metal plateau comprises tungsten.

12. An alignment mark design formed over a substrate, comprising:
   a metal plateau, formed within a first dielectric layer over the substrate; and
   a metal material formed within a second dielectric layer on the first dielectric layer, wherein the metal material is positioned above the metal plateau and the metal material and the second dielectric layer are alternating.

13. The alignment mark design according to claim 12, wherein the metal plateau is a rectangular plateau.

14. The alignment mark design according to claim 12, wherein the metal plateau comprises a plurality of metal slivers, and the metal slivers are orthogonal to the metal material.

15. The alignment mark design according to claim 12, wherein the metal plateau comprises a plurality of metal slivers, and the metal slivers are parallel to the metal material.

16. The alignment mark design according to claim 12, wherein the metal plateau and the metal material comprise a same material.

* * * * *